(12) United States Patent
Ono et al.

(10) Patent No.: US 7,014,704 B2
(45) Date of Patent: Mar. 21, 2006

(54) METHOD FOR GROWING SILICON SINGLE CRYSTAL

(75) Inventors: Toshiaki Ono, Tokyo (JP); Tadami Tanaka, Tokyo (JP); Shigeru Umeno, Tokyo (JP); Eiichi Asayama, Tokyo (JP); Hideshi Nishikawa, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 74 days.

(21) Appl. No.: 10/455,609

(22) Filed: Jun. 6, 2003

(65) Prior Publication Data

US 2004/0244674 A1    Dec. 9, 2004

(51) Int. Cl.
*C30B 15/20* (2006.01)

(52) U.S. Cl. .............................. 117/13; 117/14; 117/15; 117/18; 117/20; 117/932

(58) Field of Classification Search .................. 117/13, 117/14, 15, 18, 20, 932
See application file for complete search history.

(56) References Cited

U.S. PATENT DOCUMENTS

| 6,077,343 A * | 6/2000 | Iida et al. ........................ 117/2 |
| 6,139,625 A * | 10/2000 | Tamatsuka et al. ............ 117/19 |
| 6,191,009 B1 * | 2/2001 | Tamatsuka et al. .......... 438/471 |
| 6,228,164 B1 * | 5/2001 | Ammon et al. ................ 117/19 |
| 6,544,490 B1 * | 4/2003 | Takeno et al. ............ 423/328.2 |
| 6,548,035 B1 * | 4/2003 | Kimura et al. ............ 423/328.2 |

FOREIGN PATENT DOCUMENTS

| JP | 61-193456 | 8/1986 |
| JP | 10-208987 | 8/1998 |
| JP | 11-349393 | 12/1999 |
| JP | 2000-272997 | 10/2000 |

* cited by examiner

Primary Examiner—Robert Kunemund
(74) Attorney, Agent, or Firm—Clark & Brody (57) ABSTRACT

A method for growing a silicon single crystal used for semiconductor integrated circuit devices, wherein the single crystal is grown by the CZ method at a nitrogen concentration of $1 \times 10^{13}$ atoms/cm$^3$–$1 \times 10^{15}$ atoms/cm$^3$ with a cooling rate of not less than 2.5° C./min at a crystal temperature of 1150° C.–1000° C., in which case, the pulling rate is adjusted such that the outside diameter of a circular region including oxidation-induced stacking faults generated at the center of a wafer which is subjected to the oxidation heat treatment at high temperature is not more than ⅗ of the wafer diameter, wherein the wafer is prepared by slicing the grown single crystal. In the growth method, the concentration of oxygen in the silicon single crystal is preferably not more than $9 \times 10^{17}$ atoms/cm$^3$ (ASTM '79). With this method, the silicon single crystal, in which the generation of Grown-in defects can be effectively suppressed, can be produced in a simple process without any increase in the production cost. Moreover, a specification of the oxygen concentration and the application of the outward diffusion treatment are capable of producing a wafer, which is optimally used for monitoring particles.

3 Claims, 4 Drawing Sheets

METHOD FOR GROWING SILICON SINGLE CRYSTAL

BACKGROUND OF THE INVENTION

1. Field of the Invention

The present invention relates to a method for growing a silicon single crystal, which is used to produce semiconductor integrated circuit elements, and which method is capable of effectively suppressing the generation of Grown-in defects in a simple production process without any increase in the production cost.

2. Description of the Prior Art

Conventionally, such a silicon single crystal used as a material for large-scale integrated circuits is produced mostly by the Czokralski method (hereinafter referred to as "CZ method").

Figure 1:
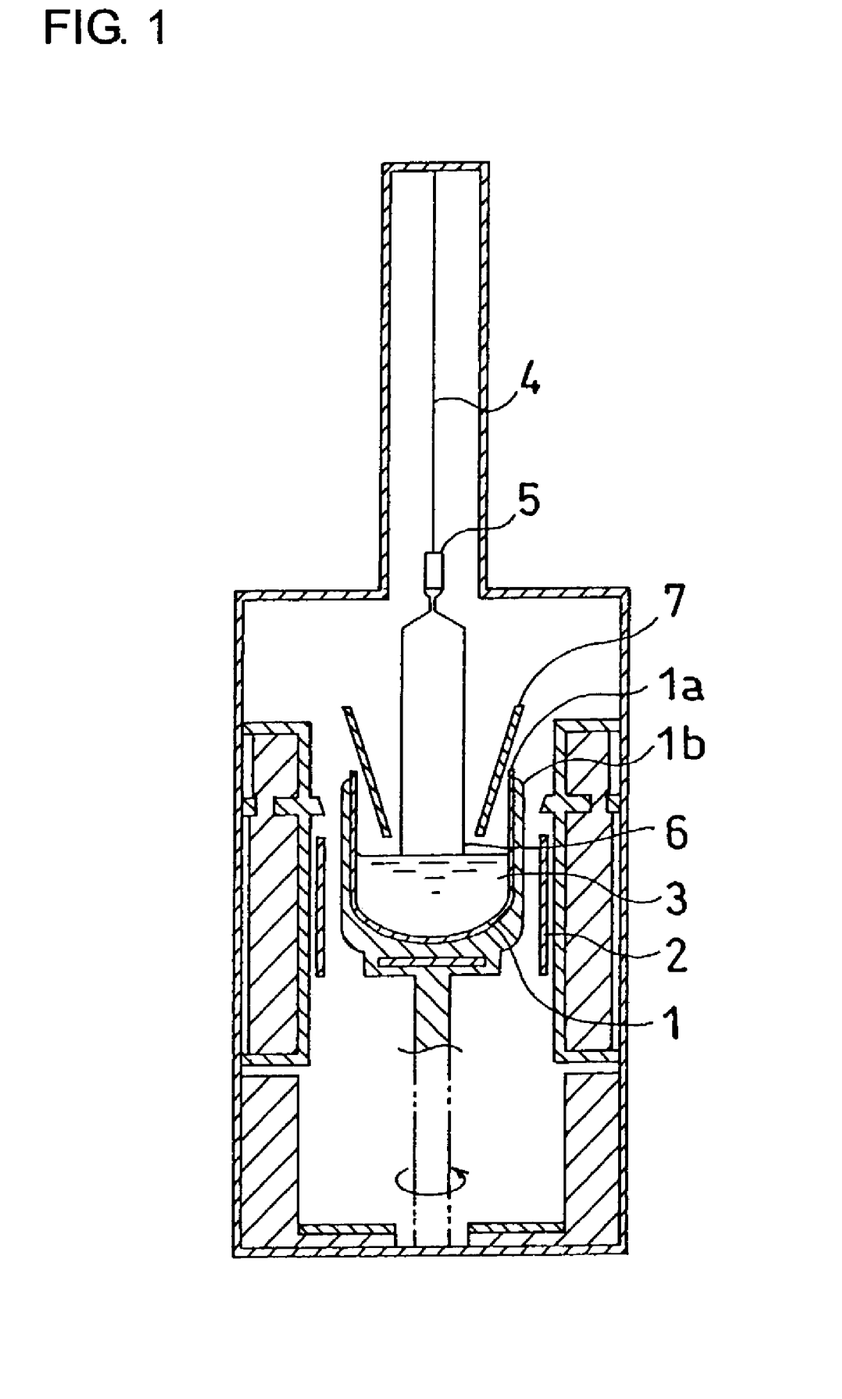
FIG. 1 is a schematic sectional view of a single crystal growing apparatus, which is used to explain the method for growing a silicon single crystal by the CZ method.

FIG. 1 is a schematic sectional view of a single crystal growth apparatus, and the drawing is used to explain the method for growing a silicon single crystal with the CZ method. A crucible 1 is disposed in the center of the growth apparatus. The crucible 1 is a double structure in which an inner vessel 1a made of quartz and an outer vessel 1b made of graphite are included. The crucible 1 having such a structural arrangement is supported on a rotary shaft in such a manner that it is rotated at a predetermined speed of revolution. A cylindrical heater 2 is coaxially disposed in the outside of the crucible 1. The crucible 1 is filled with a molten material 3, which is melted by the heater 2. A pulling shaft 4 consisting of a pulling wire and others is disposed in the center of the crucible 1 in such a way that it is hung from the upper part of the growth apparatus.

A seed crystal 5 is connected to an end of the pulling shaft 4. The seed crystal 5 is in contact with the surface of the molten material 3 in order to grow a single crystal 6. Moreover, a heat shield 7 is disposed above the surface of the molten material 3 in such a way that it surrounds the single crystal 6. The pulling shaft 4 is pulled in such a manner that the seed crystal 5 surrounded by the heat shield 7 is rotated at a predetermined speed of revolution in the direction opposite to the rotary direction of the crucible 1. In this state, the growth of the single crystal 6 is achieved by solidifying the molten material 3 at an end of the seed crystal 5.

The silicon single crystal thus grown is sliced or cut, thereby enabling silicon wafers to be produced therefrom. Such a wafer is used to produce semiconductor large-scale integrated circuit elements. It is known that a failure of the produced integrated circuit mostly results from particles. Such particles may be detected by means of a surface inspection device, which is available from the market. The results of detection reveals that the particles which are generated in the course of producing integrated circuits and/or directly from a process device itself are detected, and that defects as Voids formed during the growth of the single crystal are also detected.

In recent years, a rapid progress for increasing the integration density of the semiconductor integrated circuit elements (devices) requires a much higher and severer quality of a silicon wafer. Accordingly, a fine fabrication as for a design rule requires a very severe control of particles in a production line. In order to attain a complete control of the particles in the production line, not only a wafer for producing the devices, but also a dummy wafer for monitoring particles is introduced into the production line. It is, of course, required that such a dummy wafer for monitoring particles includes an extremely low density of crystal defects, which may be detected as particles by means of the surface inspection device.

When either a silicon single crystal produced by the CZ method or a wafer produced by slicing such a silicon single crystal is subjected to a heat treatment at high temperature under an oxidization atmosphere, ring-shaped oxidization-induced stacking faults (hereinafter referred to as "OSF rings") are occasionally generated coaxially with respect to the pulling shaft for the single crystal. In addition, several different types of micro defects are also formed on the surface. These defects are called crystal defects, which are formed during the growth of the single crystal, and they are usually referred to as so called Grown-in defects.

In the single crystal having such an OSF ring, the crystal property in the inside area is different from that in the outside area, and therefore the type of the Grown-in defects detected is also different in accordance with the area of residence. Grown-in defects relating to point defects (vacancies), which deteriorate the gate oxide integrity in a MOS type device, are generated at a density of $10^5$–$10^6$ counts/$cm^3$ in the inside area of the OSF ring. Such a grown-in defect is called a COP (Crystal Originated Particle), the inside of which has an octahedral structure of a Void as a basic shape.

In an ULSI device according to the design rule of not more than 0.35 $\mu$m, such a COP provides not only a deterioration in the gate oxide integrity, but also a device isolation failure between the elements or devices. As a result, the production of devices at high yield requires the removal of COPs from the wafer surface layer. In accordance with the results detected by means of a surface inspection device, the COPs are detected as foreign substances on the surface. Accordingly, it is necessary to reduce the size of the foreign substances or to eliminate the substances themselves in the wafer used as a particle monitor. On the other hand, dislocation clusters of the Grown-in defects relating to point defects (interstitial silicon atoms), which deteriorate the current leakage characteristic of a device, are generated at a density of $10^3$–$10^4$ counts/$cm^3$ in the outside area of the OSF ring.

Figure 2:
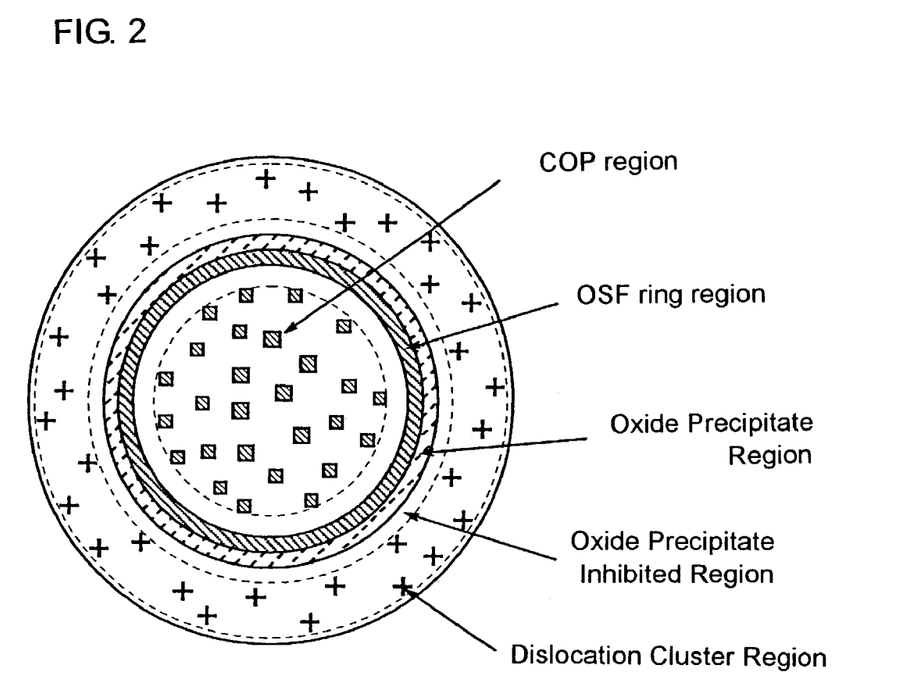
FIG. 2 is a schematic plan view of the observed surface of a grown silicon single crystal, which is subjected to an oxidation heat treatment at high temperature after slicing.

FIG. 2 is a typical plan view of an observed crystal surface, for which an oxidation treatment is carried out at a high temperature after slicing a grown silicon single crystal. A COP area is positioned at the center of the single crystal and an OSF ring region is extending to the outside thereof. There exists an oxide precipitate region in the outside of the OSF ring region. Moreover, an oxide precipitate inhibited region is extending to the outside of the oxide precipitate region, and finally there exists a dislocation cluster region at the outermost area.

On the crystal surface shown in FIG. 2, there exist no Grown-in defects, except for oxide precipitates having a very small size or those at an extremely small density, in these three regions, i.e., the OSF ring region, the oxide precipitate region connected thereto and the oxide precipitate inhibited region. As described above, the OSF ring region is an area in which oxidation-induced stacking faults (hereinafter referred to as "OSF") are formed by the heat treatment at a high temperature, and it is estimated that the nuclei for the stacking faults may be oxide precipitates. In the as-grown state before the heat treatment is carried out at a high temperature, it is extremely difficult to directly detect OSF-inducing nuclei (hereinafter referred to as "OSF nuclei"). However, in accordance with the evaluation by means of the above-mentioned surface inspection device, it is ascertained that the OSF ring region is regarded as an area in which Grown-in defects cannot be observed.

The pulling rate in the crystal growth influences on the position of generating an OSF ring. Given that the temperature gradient in the cooling rate from the melting point down to about 1300° C. during the growth of a silicon single crystal is G and that the pulling rate is V, it is found that the OSF ring generating position is controlled by a relation expressed by V/G. Accordingly, an OSF ring may be generated at an arbitrary position on the crystal surface by setting the V/G value in an appropriate range during the growth of the single crystal.

Since the OSF ring may be generated at an arbitrary position with the above-mentioned method, several methods have been proposed for reducing the Grown-in defects generated cocentrically on the wafer surface by controlling the position of generating the OSF ring. A method for reducing the density of COPs generated in the inside of an OSF ring by generating the OSF ring at the outer circumference of a wafer has been demonstrated as follows:

In Japanese Patent Publication No. 03-080338, a method for eliminating COPs in the surface layer is disclosed, wherein a silicon wafer is subjected to a heat treatment at a temperature of not less than 1100° C. under a non-oxidizable atmosphere including hydrogen gas just before a thermal oxidization layer is formed on the wafer surface. In Japanese Patent Application Laid-open Publication No. 10-208987, moreover, a method for eliminating small-sized COPs with a heat treatment is disclosed, wherein the size of the defects is decreased by increasing the density of COPs in the as-grown state. However, in any of the above-mentioned methods for reducing the density of COPs, a heat treatment is required to reduce the defects, and therefore this causes the number of process steps to be increased, and the production cost is also increased.

On the other hand, a method has been also proposed either for concentrating the defect region resulting from the COPs to the center of a wafer by forming an OSF ring in the inside of the wafer, or for eliminating the defect region at the center of a wafer by forming an OSF ring in the inside of the wafer. In the method, the single crystal has to be pulled at an extremely low rate, hence causing the productivity to be decreased. As for the wafer quality, there is a possibility that dislocations are generated by the shrinkage of the OSF ring towards the inside of the crystal.

In addition, a method has been proposed for forming the oxide precipitate region and the oxide precipitate prohibited region positioned in the outside of the OSF ring region over the entire wafer surface and for maintaining these regions to be aligned in the directions of the crystal axis. However, in order to realize this method, it is necessary to produce a hot zone in which defects are uniformly distributed on the surface, and further to grow a crystal under the condition of precisely controlling the above-mentioned V/G value. Accordingly, these make it difficult to maintain the workability.

As described above, no effective means are provided, even if the prior art is applied, that is, even if the number of defects in both the COP region and OSF ring region are reduced by controlling the position of generating the OFS ring or even if the oxide precipitate region and the oxide precipitate prohibited region are extended over the entire surface of the wafer.

To overcome these problems, the present applicant has already proposed a method for growing a silicon single crystal, wherein by doping nitrogen during the crystal growth, the entire crystal surface of a wafer includes a region consisting of OSF nuclei, or both OSF nuclei and an oxide precipitate region, or an oxide precipitate prohibited region together with these regions (see Japanese Patent Application Laid-open Publication No. 2000-272997).

In fact, it is noted that the proposed method successfully suppresses the generation of Grown-in defects in the silicon wafer thus produced without any increase in the production cost. Nevertheless, extremely small COPs occasionally remain in the center of the wafer. Such fine COPs may be visualized as pits by repeatedly cleaning the wafer, and therefore it will be expected that a further improvement is required to eliminate fine COPs in the center of the wafer.

SUMMARY OF THE INVENTION

Accordingly, it is an object of the present invention to provide a silicon single crystal and/or a silicon wafer, wherein the above-mentioned problems in the prior art are solved and the above manufacturing methods proposed are further improved, and wherein the generation of Grown-in defects can be effectively suppressed without any increase in the production cost in a simple process by specifying both the pulling condition in the CZ method and the outside diameter of a circular area of the OSF nuclei generated in the center of the wafer.

In order to clarify the effect of nitrogen doping on the behavior of defects in a silicon single crystal, the present inventors grew silicon single crystals having a 6" diameter with and without the nitrogen doping by the CZ method, and inspected the distribution of Grown-in defects therein.

Figure 3A:
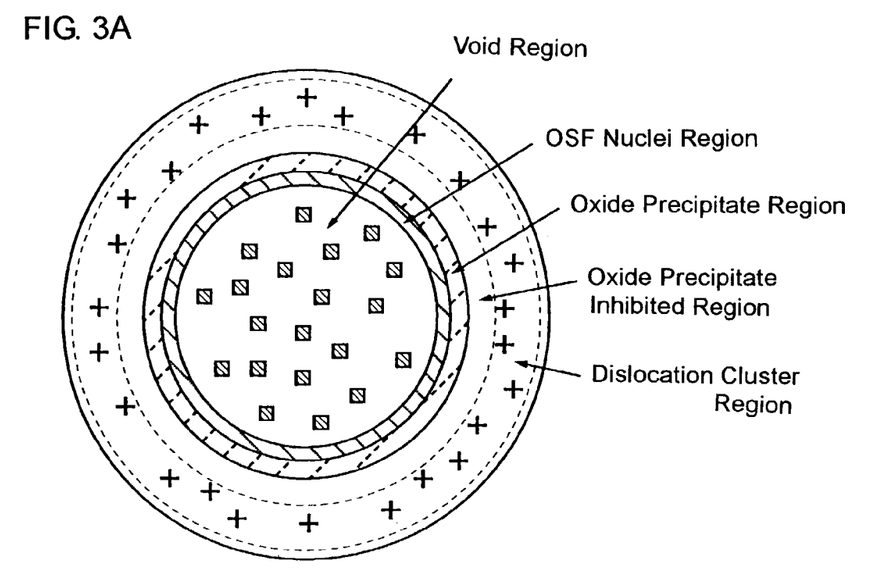
FIG. 3(a) is a schematic plan view showing the defect distribution on the observed surface of a wafer in the as-grown state, wherein the wafer is prepared by slicing a single crystal, which is grown with nitrogen doping by the CZ method.

FIG. 3(a) is a schematic plan view showing the behavior of defects on the observed surface of a wafer in the as-grown state, wherein the wafer was prepared by slicing a single crystal, which was grown without doping of nitrogen at a pulling rate of 0.7 mm/mm by the CZ method. As shown in FIG. 3(a), a COP region including Voids is formed at the center of the wafer. In the outside of the COP region, there is an area in which OSF nuclei are included and the diameter of the area is approximately half of the wafer diameter. In the outside of the OSF nuclei region, an oxide precipitate region is extended, and in the outside of the oxide precipitate region an oxide precipitate inhibited region is further extending. Finally, a dislocation cluster region is extending to the outermost circumferential area.

Figure 3B:
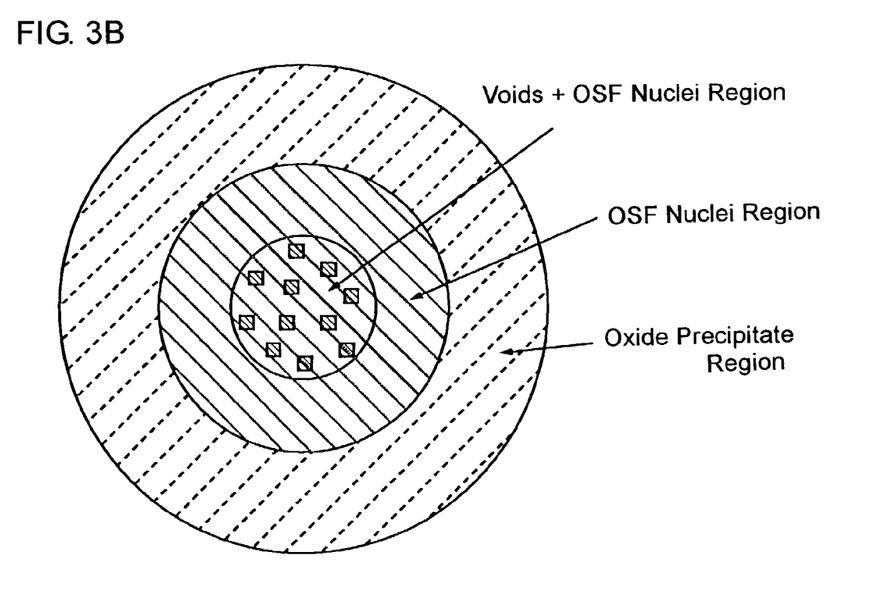
FIG. 3(b) is a schematic plan view showing the defect distribution on the observed surface of a wafer in the as-grown state, wherein the wafer is prepared by slicing a single crystal, which is grown without nitrogen doping by the CZ method.

FIG. 3(b) is a schematic plan view showing the behavior of defects on the observed surface of a wafer in the as-grown state, wherein the wafer was prepared by slicing a single crystal, which was grown at a pulling rate of 0.7 mm/min by the CZ method after doping nitrogen at a concentration of $1 \times 10^4$ atoms/cm$^3$. A mixed area of both OSF nuclei and Voids is generated at the center of the wafer.

Accordingly, the area including the OSF nuclei is extending to the center of the wafer to form a circular region. At the same time, an oxide precipitate region is also extending to the outer circumferential area in the outside of the OSF nuclei region. In the wafer which was subjected to a heat treatment at a temperature of 1100° C. for 16 hr under an oxidization atmosphere, OSFs were observed at density of not less than $10^3$/cm$^2$ in both the region of OSF nuclei and the mixed area of the OSF nuclei and the Voids.

Moreover, in order to study the effect of a thermal history on the formation of COPs in a nitrogen-doped crystal, the present inventors carried out an experiment in which a silicon single crystal having a 6" diameter was grown by the CZ method after doping nitrogen, in which case, the pulling rate was changed during the crystal growth. In the actual procedure of experiment, a molten silicon material was doped with nitrogen at a concentration of $1 \times 10^4$ atoms/cm$^3$ and a single crystal was grown at a pulling rate of 0.7 mm/min by an axial length of 500 mm to form a main body of the single crystal. At the axial length of 500 mm, the single crystal was further grown at a pulling rate of 1.4 mm/min, and then at an axial length of 550 mm, the crystal growth was again carried out at the initial pulling rate of 0.7 mm/min by the axial length of 850 mm and the pulling process was ended to provide a tapered shape in the single crystal.

In the single crystal thus grown, the change of the pulling rate allows the thermal history to be altered. That is, the acceleration of the pulling speed provides, as for the single crystal, a heat treatment of substantially quenching from the temperature in the moment of starting the change of the pulling rate to a temperature lower than the above-mentioned temperature in the vicinity of 100° C. or so. In the single crystal thus doped with nitrogen and thus quenched by the change of the pulling rate, it was confirmed that a behavior of distribution of defects similar to that shown in FIG. 3(b) was observed.

Figure 4:
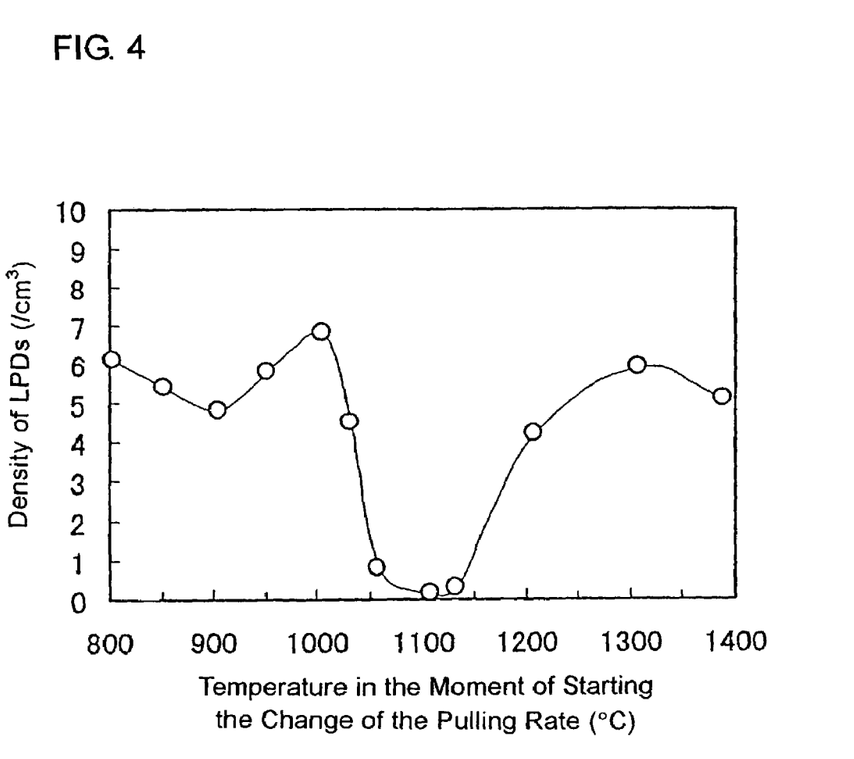
FIG. 4 is a diagram showing the relationship between the temperature in the moment of starting the change of the pulling rate and the density of LPDs.

FIG. 4 is a diagram showing the relationship between the density of light point defects (LPD) on the wafer surface and the temperature in the moment of starting the change of the pulling rate. The tested wafers were prepared by slicing a crystal portion quenched from a crystal temperature of 1400–800° C. and by ten times repeating the Standard Cleaning-1 (hereinafter referred to as "SC-1", in which the cleaning is carried out by using alkaline chemical liquid mainly containing NH$_4$OH, H$_2$O$_2$ and H$_2$O). The density of LPDs was measured, using a surface inspection device.

From the diagram shown in FIG. 4, it can be recognized that an increase in the number of SC-1 allows fine Voids in the vicinity of the wafer surface to be visualized and detected as LPDs. However, it can also be recognized that the quenching from the crystal temperature at a range of 1150° C.–1000° C. in the pulling process causes the density of LPDs to be significantly reduced.

For the sake of confirmation, a similar experimental test of changing the pulling rate was carried out to determine the density of LPDs as for a crystal, which was not doped with nitrogen. In this case, however, a number of LPDs were observed. In fact, when a crystal was not doped with nitrogen and quenched from a crystal temperature of 1150° C.–1000° C. during the crystal growth, the surface inspection device enabled a number of LPDs to be observed in the vicinity of the wafer surface, to which the SC-1 was several times applied. It can be stated, therefore, that nitrogen doping causes the diffusion velocity of vacancies in the crystal to be decelerated, and further quenching the crystal at a temperature range of 1150° C.–1000° C. causes the formation of vacancies to be completely suppressed.

The present invention is completed, based on the above-mentioned investigations of the effect of doped nitrogen on the behavior of defects in the CZ method as well as on the experimental results regarding the change of the pulling rate. The gist of the invention is the following methods (1) and (2) for growing a silicon single crystal:

(1) A method for growing a silicon single crystal by pulling the single crystal in the CZ method, comprising the following steps: doping nitrogen at a concentration of $1 \times 10^{13}$ atoms/cm$^3$–$1 \times 10^{15}$ atoms/cm$^3$ during the puling of the single crystal; setting a cooling rate of not less than 2.5° C./min at a crystal temperature of 1150° C.–1000° C.; and adjusting the pulling rate such that the outside diameter of a circular region including oxidation-induced stacking faults generated at the center of a wafer, which is subjected to the oxidation heat treatment at high temperature, is no more than ⅗ of the wafer diameter, wherein the wafer is prepared by slicing the grown single crystal.

(2) In the above-mentioned method for growing a silicon single crystal, the concentration of oxygen in the silicon single crystal is preferably not more than $9 \times 10^{17}$ atoms/cm$^3$ (ASTM '79). Moreover, even if the wafer is prepared by slicing the single crystal, which is grown at an oxygen concentration of more than $9 \times 10^{17}$ atoms/cm$^3$, it is preferable that the outward diffusion treatment of oxygen is applied to the wafer at high temperature, because the generation of OSFs can be suppressed and the electrical property can be improved.

DESCRIPTION OF PREFERRED EMBODIMENTS

In the method according to the present invention, a silicon single crystal is grown by the CZ method after doping with nitrogen, and then quenched at a crystal temperature of 1150° C.–1000° C., before producing wafers by slicing the silicon single crystal. In the crystal growth, the pulling speed of the crystal to be grown is adjusted in such a way that the outside diameter of a circular OSF area at the center of the wafer becomes to be not more than ⅗ of the wafer diameter, when the heat treatment is carried out at high temperature. In the case of the as-grown state shown in FIG. 3(b), the circular OSF area corresponds to the area including both an OSF nuclei region and a mixed area of OSF nuclei and Voids.

In the step of the crystal growth by the CZ method, the silicon single crystal is doped with nitrogen at a concentration of $1 \times 10^{13}$ atoms/cm$^3$–$1 \times 10^{15}$ atoms/cm$^3$. Since the effect of suppressing the diffusion of vacancies by the doping of nitrogen is dominant at a concentration of not less than $1 \times 10^{13}$ atoms/cm$^3$, the lower limit of the concentration is specified by this value. On the other hand, the nitrogen doping at a much higher concentration causes the OSF nuclei to be formed at a high density on the entire crystal surface in the as-grown state, so that the value, $1 \times 10^{15}$ atoms/cm$^3$, is specified as the upper limit of concentration.

In this case, the concentration of nitrogen doped in the wafer can be estimated from the content of nitrogen doped in the silicon before the crystal growth, the distribution coefficient of nitrogen in the liquid and solid phases of silicon, and the solidification rate of the crystal. The initial concentration $C_0$ of nitrogen in silicon can be estimated from the atomic weight of silicon material and the atomic number of nitrogen added thereto, and the concentration $C_N$ of nitrogen in a crystal can be calculated by the following equation (a):

$$C_N = C_0 K (1-x)^{K-1} \qquad (a)$$

In the equation (a) described above, K is the equilibrium segregation coefficient of nitrogen and $7 \times 10^{-4}$ can be used as K. Symbol x is the rate of solidification and it can be expressed by the ratio of the weight of the pulled crystal to the initial charged weight.

Generally, the growth of a single crystal at a high pulling speed allows the OSF nuclei region to be generated in the outer circumferential area, whereas the growth at a low pulling rate causes the OSF nuclei region to be shrunk from the outer circumferential area to the inside. When an OSF nuclei region is formed in the inside of the wafer, the shrinkage of the Void defects by the doping nitrogen can be effectively achieved. On the contrary, when an OSF nuclei region is formed either in the outermost circumferential area or the outside of the wafer, the shrinkage of the Void defects cannot usually be achieved.

In the method according to the present invention, the pulling rate is adjusted in such a way that the outside diameter of the circular OSF region formed in the center of the wafer is not more than ⅗ of the wafer diameter, so that the Void defects may be effectively shrunk with the aid of the doping nitrogen.

Moreover, in the method according to the present invention, the cooling rate of the silicon single crystal is set not less than 2.5° C./min at a temperature range of 1150° C.–1000° C. The reason why a crystal temperature to be dealt should be restricted to 1150° C.–1000° C. is due to the fact that such a temperature range is suitable for forming the Voids and further the density of LPDs can be greatly reduced by quenching the single crystal at the temperature in the range, as shown in FIG. 4.

In addition, the cooling rate of not less than 2.5° C./min is determined from the results in the trial tests, which will be described in Examples, in order to completely suppress the formation of vacancies. Although there is no special limitation on the upper limit of the cooling rate, an excessive cooling of the single crystal during the crystal growth causes residual stress to be generated inside the crystal, thereby inducing possible cracks in the single crystal. Accordingly, it is preferable that the cooling rate should be set no more than 8.5° C./min.

In a wafer used for monitoring, no special specification is given on the concentration of oxygen included in the crystal. However, a decrease in the concentration of oxygen during the crystal growth makes it possible to reduce the density of OSF nuclei generated therein. From the fact that a wafer prepared by slicing a single crystal grown at an oxygen concentration of no more than $9 \times 10^{17}$ atoms/cm³ has an excellent electrical property, the present inventors has clarified that such a wafer can be used not only as a wafer for monitor, but also as a wafer for production.

The wafer produced by the method according to the present invention makes it possible to suppress the generation of OSFs by the outward diffusion treatment of oxygen, even if the wafer is prepared by slicing a single crystal grown at an oxygen concentration of greater than $9 \times 10^{17}$ atoms/cm³, thereby enabling the electrical property to be improved. In fact, it is found that the outward diffusion treatment of oxygen makes it possible to shrink or eliminate OSF nuclei in the vicinity of the wafer surface and therefore to produce wafers having neither Voids nor OSF nuclei on the entire surface thereof.

Since the outward diffusion of the oxygen at a higher temperature accordingly provides a greater decrease in the period of the treatment, the treatment should be carried out at a temperature of preferably not less than 900° C. Moreover, since the outward diffusion treatment under a non-oxidizable atmosphere suppresses the growth of an oxide layer on the wafer surface, the oxygen concentration in the vicinity of the surface is decreased more strongly, thereby enabling the effect of the outward diffusion treatment to be further enhanced.

The nitrogen doping method employed in the present invention may be selected from the conventional methods: In one method, nitrides are beforehand mixed with the original material or molten material; or in another method, the growth of the single crystal is carried out by flowing a nitrogen gas or nitride gas into the furnace; or in another method, a nitrogen gas or nitride gas is splayed onto a polycrystalline silicon at high temperature.

Moreover, the present invention can be realized by employing either a doping method in which the growth of a single crystal is carried out by adding to a silicon material a FZ silicon crystal containing nitrogen or wafers on whose surface a silicon nitride layer is formed; or a doping method in which nitrogen is added to the silicon material by fusing a polycrystalline silicon in a gas atmosphere of nitrogen or nitride; or a doping method in which the growth of the single crystal is carried out by employing a nitride crucible or a quartz crucible to which nitrogen is added.

EXAMPLES

In order to verify the advantages of the present invention, the confirmation experiments were carried out in the following two Examples 1 and 2. While the experimental results will be described in detail, the gist of the invention is not restricted solely to these Examples.

Example 1

Using the crystal growth apparatus shown in FIG. 1, p-type (100) silicon single crystals having an 8 inch (203.2 mm) diameter were grown by doping with nitrogen at a concentration of $4.0 \times 10^{12}$ atoms/cm³–$1.3 \times 10^{14}$ atoms/cm³. Each of the single crystals was grown at an initial oxygen concentration of $8.5 \times 10^{17}$ atoms/cm³–$9.8 \times 10^{17}$ atoms/cm³ (ASTM '79) under a condition of pulling the crystal where the OSF nuclei region existed on a crystal surface. In this case, the cooling rate in a temperature range of 1150° C.–1000° C. was varied within a range of 1.56° C./min–2.87° C./min by changing both the pulling rate and the conditions for the heat shield material. The conditions for growth are listed in Table 1.

Wafers were prepared by slicing each of the single crystals thus grown, and then the surface of each wafer was ground and further cleaned. Subsequently, the wafers were subjected to a heat treatment at a high temperature of 1100° C. for 16 hr. Thereafter, the wafers were subjected to a selective etching with a wright etchant for 2 min and the ground surface of the wafers was observed by an optical microscope, so that the etch pits were counted to determine the density thereof and the OSF region formed on the surface of the wafer was further discerned.

Moreover, in order to visualize the Void defects, the SC-1 was repeatedly ten times applied to the wafers prepared by slicing the single crystal, and the LPDs (light point defects) were counted, using a surface inspection device (KLA-Tencor Corp.; Surfscan 6200). The outside diameter of the circular OSF region and the density of LPDs, both obtained in the measurement, are also summarized in Table 1.

TABLE 1

| | Pulling Conditions | | | Measurement Results | | |
|---|---|---|---|---|---|---|
| | | | | The Outside Diameter of Circular OSF Region | | |
| Sample | Nitrogen Concentration (atoms/cm$^3$) | Oxygen Concentration (atoms/cm$^3$) | Cooling Rate (° C./min) | Distance from Wafer Center (mm) | Ratio to Wafer Diameter | Density of LPDs (counts/cm$^2$) |
| Sample 1 | 9.2 × 10$^{13}$ | 9.8 × 10$^{17}$ | 3.51 | 51 | 0.50 | 0.02 |
| Sample 2 | 1.1 × 10$^{14}$ | 8.5 × 10$^{17}$ | 2.58 | 53 | 0.52 | 0.02 |
| Sample 3 | 1.3 × 10$^{14}$ | 9.2 × 10$^{17}$ | 2.71 | 75 | *0.74 | 14.3 |
| Sample 4 | *4.0 × 10$^{12}$ | 9.2 × 10$^{17}$ | 2.87 | 58 | 0.57 | 15.6 |
| Sample 5 | 8.6 × 10$^{13}$ | 9.8 × 10$^{17}$ | *1.56 | 57 | 0.56 | 7.8 |
| Sample 6 | 1.4 × 10$^{14}$ | 9.0 × 10$^{17}$ | *2.17 | 53 | 0.52 | 0.95 |

Note:
mark * in the table means the outside of the specification according to the present invention.

From the result shown in Table 1, it is clearly found that, even after repeatedly ten times cleaning, LPDs could hardly be observed in the wafer, which was prepared from a single crystal produced at a nitrogen concentration of not less than 1×10$^{13}$ atoms/cm$^3$ and at a cooling rate of not less than 2.5° C./min in a temperature range of 1150° C.–1030° C., in which case, the circular OSF region had an outside diameter of not more than ⅗ (0.52) of the wafer diameter (Samples 1 and 2).

On the contrary, a number of LPDs were observed in the center of the wafer, which was prepared from the single crystal cooled at a cooling rate of not more than 2.5° C./min, even if both the nitrogen concentration and the outside diameter of the circular OSF region were outside the ranges specified by the present invention (Samples 5 and 6). This may suggest that such an insufficient quenching causes the formation of Voids to be incompletely suppressed.

In the wafer in which the outside diameter of the circular OSF region was not less than ⅗ (0.74) of the wafer diameter, a number of LPDs were also observed at the center of the wafer, even if the other conditions were within the range specified by the present invention (Sample 3). Moreover, in the case when the nitrogen concentration was less than 1×10$^{13}$ atoms/cm$^3$, a number of LPDs were observed at the center of the crystal, because the effect of suppressing the generation of the Voids due to the doped nitrogen was insufficient (Sample 4).

Example 2

Similarly to Example 1, p-type (100) silicon single crystals having an 8 inch diameter were grown by doping with nitrogen at a concentration of 1.1–1.6×10$^{14}$ atoms/cm$^3$. Each of the single crystals was grown at an initial oxygen concentration of 8.5×10$^{17}$ atoms/cm$^3$–13.1×10$^{17}$ atoms/cm$^3$ (ASTM '79) by controlling the pulling rate such that the outside diameter of the OSF nuclei region after the heat treatment at high temperature was not more than ⅗ of the wafer diameter. In this case, the cooling rate in a temperature range of 1150° C.–1000° C. was 2.25–2.67° C./min, i.e., an approximately constant.

Similarly to Example 1, a heat treatment was carried out at a temperature of 1100° C. for 16 hr as for each of the wafers prepared, and subsequently the surface thereof was selectively etched. Thereafter, the OSF region on the surface of the wafer was observed using an optical microscope. In conjunction with this, wafers were prepared by slicing the grown single crystal, and the wafer was subjected to an outward diffusion treatment of oxygen for 4 hr at 1150° C., after grinding and cleaning the surface of the wafer. Thereafter, the thickness of the layer including no defects was determined, using an infrared scattering device (Mitsui Mining and Smelting Co.; MO601) to examine the perfection of the wafer surface. The outside diameter of the circular OSF region and the other results obtained in the investigation are summarized in Table 2.

TABLE 2

| | Pulling Conditions | | | Measurement Results | | |
|---|---|---|---|---|---|---|
| | | | | The Outside Diameter of Circular OSF Region | | Thickness of Non-Defect |
| Sample | Nitrogen Concentration (atoms/cm$^3$) | Oxygen Concentration (atoms/cm$^3$) | Cooling Rate (° C./min) | Distance from Wafer Center (mm) | Ratio to Wafer Diameter | Layer on Wafer Surface (μm) |
| Sample 7 | 1.1 × 10$^{14}$ | 8.5 × 10$^{17}$ | 2.58 | 53 | 0.52 | >10 μm |
| Sample 8 | 1.2 × 10$^{14}$ | 11.9 × 10$^{17}$ | 2.67 | 54 | 0.53 | 5.7 μm |
| Sample 9 | 1.6 × 10$^{14}$ | 13.1 × 10$^{17}$ | 2.52 | 57 | 0.56 | 3.7 μm |

An oxygen concentration of not more than 9×10$^{17}$ atoms/cm$^3$ provides a non-surface defect layer having a thickness of not less than 10 μm and a good electrical property. However, an oxygen concentration of not less than 10×10$^{17}$ atoms/cm$^3$ provides an increase in the size of the OSFs formed in the course of the crystal growth, thereby enabling the thickness of the non-surface defect layer to be decreased in the vicinity of the wafer surface.

As described above, in accordance with the method for growing a silicon single crystal according to the present invention, a proper specification of both the pulling conditions in the CZ method and the outside diameter of a circular OSF nuclei region generated at the center of the wafer allows a silicon single crystal and a silicon wafer to be produced in a simple process without any increase in the production cost and also the generation of Grown-in defects to be effectively suppressed.

Furthermore, a proper specification of the oxygen concentration as well as the application of the outward diffusion treatment of oxygen makes it possible to produce a wafer optimally used for monitoring particles or a wafer effectively used for manufacturing devices wherein the density of defects are reduced.

What is claimed is:

1. A method for growing a silicon single crystal by pulling the single crystal in the Czokralski method, comprising the following steps:
   doping nitrogen at a concentration of $1\times10^{13}$ atoms/cm$^3$–$1\times10^{15}$ atoms/cm$^3$ during the pulling of the single crystal;
   setting a cooling rate of not less than 2.5° C./min at a crystal temperature of 1150° C.–1000° C.; and
   adjusting the pulling rate such that the outside diameter of a circular region including oxidation-induced stacking faults generated at the center of a wafer which is subjected to an oxidation heat treatment at high temperature is not more than ⅗ of the wafer diameter, wherein the wafer is prepared by slicing the grown single crystal.

2. A method for growing a silicon single crystal according to claim 1, wherein the concentration of oxygen in the silicon single crystal is not more than $9\times10^{17}$ atoms/cm$^3$ (ASTM '79).

3. A method for growing a silicon single crystal by pulling the single crystal in the Czokralski method, comprising the following steps:
   doping nitrogen at a concentration of $1\times10^{13}$ atoms/cm$^3$–$1\times10^{15}$ atoms/cm$^3$ during the pulling of the single crystal;
   setting a cooling rate of not less than 2.5° C./min at a crystal temperature of 1150° C.–1000° C.;
   adjusting the pulling rate such that the outside diameter of a circular region including oxidation-induced stacking faults generated at the center of a wafer which is subjected to an oxidation heat treatment at high temperature is not more than ⅗ of the wafer diameter, wherein the wafer is prepared by slicing the grown single crystal; and
   applying an outward diffusion treatment of oxygen to the wafer prepared by slicing the grown single crystal.

* * * * *